(12) United States Patent
Chong et al.

(10) Patent No.: US 8,017,487 B2
(45) Date of Patent: Sep. 13, 2011

(54) METHOD TO CONTROL SOURCE/DRAIN STRESSOR PROFILES FOR STRESS ENGINEERING

(75) Inventors: Yung Fu Chong, Singapore (SG);
Zhijiong Luo, Carmel, NY (US);
Judson Robert Holt, Wappingers Falls, NY (US)

(73) Assignees: GLOBALFOUNDRIES Singapore Pte. Ltd., Singapore (SG); International Business Machines Corporation (IBM)

( * ) Notice: Subject to any disclaimer, the term of this patent is extended or adjusted under 35 U.S.C. 154(b) by 451 days.

(21) Appl. No.: 11/399,016

(22) Filed: Apr. 5, 2006

(65) Prior Publication Data

US 2007/0235802 A1    Oct. 11, 2007

(51) Int. Cl.
*H01L 21/336* (2006.01)

(52) U.S. Cl. ........... 438/300; 257/E21.431; 257/E21.43; 257/E21.634

(58) Field of Classification Search ............... 438/299, 438/300, 269, 197; 257/346, E21.634, 69, 257/E21.409, E21.43, E21.431
See application file for complete search history.

(56) References Cited

U.S. PATENT DOCUMENTS

| | | | |
|---|---|---|---|
| 5,442,205 A | | 8/1995 | Brasen |
| 5,821,577 A * | | 10/1998 | Crabbe' et al. ............... 257/288 |
| 6,274,894 B1 * | | 8/2001 | Wieczorek et al. ........... 257/192 |
| 6,323,525 B1 | | 11/2001 | Noguchi |
| 6,342,421 B1 * | | 1/2002 | Mitani et al. ................. 438/300 |
| 6,483,158 B1 * | | 11/2002 | Lee .............................. 257/408 |
| 6,831,292 B2 | | 12/2004 | Currie et al. |
| 6,844,227 B2 | | 1/2005 | Kubo |
| 6,861,318 B2 * | | 3/2005 | Murthy et al. ................ 438/299 |
| 6,881,635 B1 * | | 4/2005 | Chidambarrao et al. ..... 438/300 |
| 6,921,913 B2 | | 7/2005 | Yeo |
| 7,078,285 B1 * | | 7/2006 | Suenaga ........................ 438/199 |
| 7,510,925 B2 * | | 3/2009 | Miyanami ..................... 438/197 |
| 7,544,997 B2 * | | 6/2009 | Zhang et al. .................. 257/344 |
| 7,554,110 B2 * | | 6/2009 | Yu et al. .......................... 257/18 |
| 2002/0055216 A1 * | | 5/2002 | Takeuchi ...................... 438/221 |
| 2003/0139012 A1 * | | 7/2003 | Yamauchi et al. ............ 438/269 |
| 2003/0234422 A1 * | | 12/2003 | Wang et al. ................... 257/336 |
| 2004/0262694 A1 | | 12/2004 | Chidambaram |
| 2005/0023576 A1 * | | 2/2005 | Lee et al. ...................... 257/288 |
| 2005/0054168 A1 | | 3/2005 | Currie et al. |
| 2005/0082522 A1 | | 4/2005 | Huang |
| 2005/0148147 A1 * | | 7/2005 | Keating et al. ................ 438/299 |
| 2005/0170594 A1 * | | 8/2005 | Yeo et al. ...................... 438/300 |
| 2006/0087000 A1 * | | 4/2006 | Okuno .......................... 257/506 |
| 2006/0088968 A1 * | | 4/2006 | Shin et al. ..................... 438/299 |
| 2006/0138398 A1 * | | 6/2006 | Shimamune et al. .......... 257/19 |
| 2006/0151776 A1 * | | 7/2006 | Hatada et al. ................... 257/19 |
| 2006/0166492 A1 * | | 7/2006 | Orlowski et al. ............. 438/637 |
| 2006/0183292 A1 * | | 8/2006 | Chen et al. .................... 438/400 |
| 2006/0202234 A1 * | | 9/2006 | Hara ............................. 257/213 |
| 2006/0214236 A1 * | | 9/2006 | Chien ........................... 257/387 |

(Continued)

*Primary Examiner* — Matthew C Landau
*Assistant Examiner* — Latanya Crawford
(74) *Attorney, Agent, or Firm* — Horizon IP Pte Ltd (57) ABSTRACT

A strained channel transistor structure and methods of forming a semiconductor device are presented. The transistor structure includes a strained channel region having a first semiconductor material with a first natural lattice constant. A gate dielectric layer overlying the strained channel region, a gate electrode overlying the gate dielectric layer and a source region and drain region oppositely adjacent to the strained channel region are provided. One or both of the source region and drain region include a stressor region having a second semiconductor material with a second natural lattice constant different from the first natural lattice constant. The stressor region has graded concentration of a dopant impurity and/or of a stress inducing molecule.

21 Claims, 4 Drawing Sheets

U.S. PATENT DOCUMENTS

| | | | |
|---|---|---|---|
| 2007/0020864 A1* | 1/2007 | Chong et al. | 438/300 |
| 2007/0020867 A1* | 1/2007 | Ieong et al. | 438/301 |
| 2007/0054447 A1* | 3/2007 | Tai et al. | 438/197 |
| 2007/0173022 A1* | 7/2007 | Wang et al. | 438/272 |
| 2007/0190731 A1* | 8/2007 | Chen et al. | 438/299 |
| 2007/0196996 A1* | 8/2007 | Han et al. | 438/424 |
| 2007/0210301 A1* | 9/2007 | Han | 257/18 |
| 2007/0210314 A1* | 9/2007 | Winstead et al. | 257/69 |
| 2007/0224772 A1* | 9/2007 | Hall et al. | 438/400 |
| 2008/0124877 A1* | 5/2008 | Pei | 438/300 |
| 2008/0157266 A1* | 7/2008 | Chen et al. | 257/510 |

\* cited by examiner

METHOD TO CONTROL SOURCE/DRAIN STRESSOR PROFILES FOR STRESS ENGINEERING

BACKGROUND OF INVENTION

1) Field of the Invention

This invention generally relates to the devices and methods for the fabrication of semiconductor devices, and more particularly to the fabrication of Field Effect Transistors (FETs) having embedded Source/Drain regions with controlled impurity profiles.

2) Description of the Prior Art

It is now well-known that SiGe can be embedded into the source/drain (S/D) regions of PFETs to generate uniaxial stress in the silicon channel. This in turn increases the carrier mobility in the PFET channel and thus enhances the PFET device performance significantly. However, the integration of embedded SiGe (eSiGe) into the normal CMOS process flow is extremely challenging. The extent of performance enhancement also depends strongly on the stress generated by the SiGe itself, the active dopant concentration in the eSiGe and the proximity of the stressor to the channel region.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,921,913: Strained-channel transistor structure with lattice-mismatched zone—Strained-channel transistor structure includes portions of source and drain regions adjacent to strained channel region and lattice mismatched with respect to channel region. Inventor: Yeo, Yee-Chia; Singapore, Singapore U.S. Pat. No. 5,442,205: Semiconductor heterostructure devices with strained semiconductor layers—Semiconductor heterostructure devices with strained semiconductor layers—have monocrystalline silicon substrate, spatially graded epitaxial layer of germanium-silicon, spatially ungraded layers of germanium-silicon and epitaxial layer of germanium or silicon. Inventor: Brasen, Daniel.

U.S. Pat. No. 6,831,292 and US20050054168A1: Semiconductor structures employing strained material layers with defined impurity gradients and methods for fabricating same—Semiconductor structure has strained layer(s) with specified impurity gradient. Inventor: Currie, Matthew; et al.

U.S. Pat. No. 6,844,227: Semiconductor devices and method for manufacturing the same—Field effect transistor includes a channel layer whose thickness is a critical film thickness or less so that dislocation due to strain may not be caused depending on the carbon content. Inventor: Kubo, Minoru; Mie, Japan US20040262694A1: Transistor device containing carbon doped silicon in a recess next to MDD to create strain in channel—Metal oxide semiconductor transistor e.g. NMOS transistor has stress inducing regions on opposite of channel, such that distance between source and drain extension regions is greater than distance between stress inducing regions. Inventor: Chidambaram, P R U.S. Pat. No. 6,323,525: MISFET semiconductor device having relative impurity concentration levels between layers—MISFET element for semiconductor IC—has source and drain areas formed from n+ type semiconductor layer and n− type semiconductor layer—Inventor: Noguchi, Mitsuhiro US20050082522A1: Strained channel transistor formation—Transistor comprises strained channel region formed of first material and being intermediate source region and drain region Inventor: Huang, Yi-Chun;

SUMMARY OF THE INVENTION

The example embodiments of the present invention provide a structure and a method of manufacturing a transistor having a strained channel region which is characterized as follows.

An example embodiment method for forming semiconductor device comprising the steps of:
  providing a FET gate structure over a substrate;
  performing an etch to form a recess adjacent to the FET gate structure;
  forming an epitaxial layer over the sidewalls and bottom of the recess so to form rounded corners and to form a rounded corner recess;
  forming a stressor layer filling the rounded corner recess; the stressor is doped with an impurity.

Another example embodiment method for forming semiconductor device comprises the steps of:
  providing a PFET gate structure over a substrate;
  providing PFET SDE regions adjacent to the PFET gate structure;
  providing isolation regions in the substrate;
  performing an anisotropic etch to form a recess adjacent to the PFET gate structure;
  the recess has substantially straight sidewalls and a substantially flat bottom;
  performing a epitaxy preclean of the substrate;
  forming an epitaxial layer over the sidewalls and bottom of the recess to form rounded corners in the recess and to form a rounded corner recess;
  forming a stressor layer filling the rounded corner recess; the epitaxial layer and the stressor layer are formed in-situ;
  annealing the substrate to form source/drain regions that diffuse from the stressor region into the substrate.

Another example embodiment is the semiconductor device comprised of:
  a FET gate structure over a FET region in a substrate;
  FET SDE regions in the substrate adjacent to the FET gate structure;
  isolation regions in the substrate around the FET region;
  a recess in the substrate adjacent to the PFET gate structure;
  the recess has substantially straight sidewalls and a substantially flat bottom;
  an epitaxial layer over the sidewalls and bottom of the recess so to form rounded corners in the recess and to form a rounded corner recess;
  a stressor layer filling the rounded corner recess; the stressor is doped with an impurity.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

A. Overview

An example embodiment is a method to form a strained channel transistor using a stressor region. The recess for the stressor region is preferably formed using an anisotropic etch. An epitaxial layer is preferably formed in the recess. Then a graded stressor region is formed has a gradual change in dopant impurity concentration and/or in stress inducing atom concentration. The graded stressor region overlaps at least a portion of the source/drain region.

An example method embodiment comprises the following.
form gate structure and Source/drain extension (SDE) regions
form recess preferably using anisotropic etch
form epitaxially grown layer in recess (lightly doped Si or SiGe buffer layer)
form graded stressor layer in recess with graded dopant concentration and/or stressor atom concentration.
reform spacers on gate structure
the profile of the S/D stressor is not defined by the recess depth/profile
anneal structure to diffuse dopant from graded stressor region into substrate to form S/D region The example embodiment allows the flexibility of using the epitaxy process to tailor the S/D stressor profile, rather than relying on the isotropic recess etch process alone. This is done by using a multi-step epitaxy process after an anisotropic dry S/D recess etch. In general, anisotropic RIE is more stable than isotropic dry etch and is less susceptible to microloading effects from a neighboring protective layer.

In an example embodiment for PFETs with embedded SiGe, we first provide a gate structure with a nitride hard mask and offset spacers, and with SDE implants in place. Then we form nitride spacers adjacent to the offset spacers.

Subsequently, we perform an anisotropic RIE to etch the substrate to form the recessed S/D regions. Next, we perform a multi-step epitaxy process with varying growth conditions (such as gas chemistries and flow rates) to tailor the S/D stressor profile. For e.g., we can first form a lightly doped Si or SiGe buffer layer that rounds the corner of the Si recess, followed by epitaxial growth of in-situ boron doped SiGe with graded concentrations. The last SiGe layer towards the surface should preferably be highly doped with impurities (1E20 to 2E21/$cm^3$) such that the boron atoms can diffuse toward the SDE regions upon subsequent spike annealing. In this way, the series resistance can also be significantly reduced.

The example embodiments of the present invention can produce two kinds of stress modes (tensile or compression) exerted on the stressed-channel region.

MORE DETAILED DESCRIPTION OF AN EXAMPLE EMBODIMENT

The example embodiments of the present invention will be described in detail with reference to the accompanying drawings. The example embodiments provide a method of forming a FET with a S/D stressor region with graded concentrations. The example below describes a PFET device, but the embodiment can also be used to form NFET devices.

A. Provide a PFET Gate Structure Over a Substrate

Figure 1:
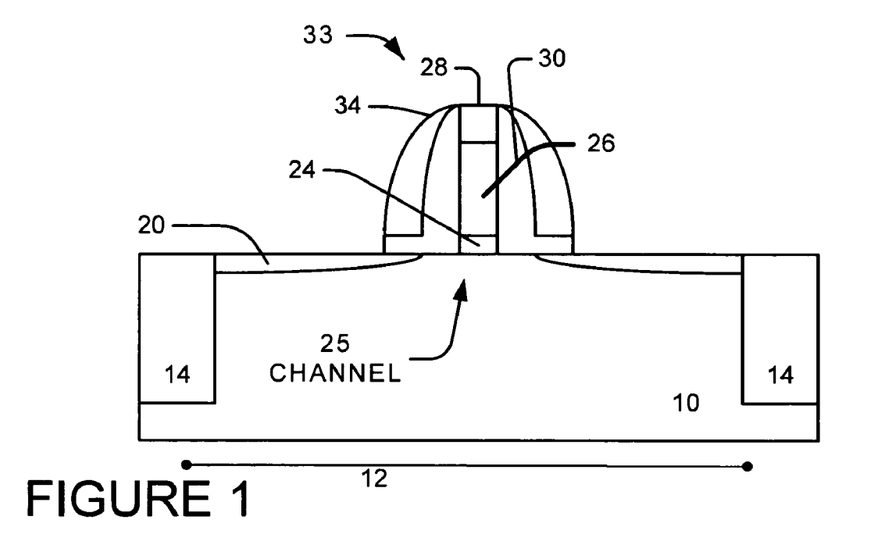
FIGS. 1, 2, 3, 4A and 5 are cross sectional views for illustrating a method for manufacturing FETs having strained channels according to an example embodiment of the present invention.

Referring to FIG. 1, we provide a PFET gate structure 33 over a PFET region 12 in a substrate 10.

The substrate 10 is preferably comprised of a first semiconductor material. The substrate 10 is preferably substantially comprised of silicon, with a natural lattice constant. The substrate can be a silicon wafer or any other appropriate semiconductor substrate.

PFET devices are preferably formed in the PFET region 12. The PFET region 12 can be comprised of a N-well (not shown).

The PFET gate structure can be comprised of a gate electrode and a gate dielectric and is not limited to the example shown in the figs.

FIG. 1 shows a preferred PFET gate structure 33 that is comprised of a PFET gate dielectric 24, a PFET gate 26, a PFET channel 25, PFET gate capping layer 28, PFET first (L-shaped) spacers 30, and PFET second spacers 34.

An example of the scale and a composition of the PFET gate structure 33 is given below.

The PFET gate dielectric 24 can be comprised of $SiO_xN_y$, nitrided $SiO_2$ (either by plasma or thermal means, or a combination thereof), $HfO_2$, $HfSi_xO_y$, $HfAl_xO_y$ and can have a thickness between 8 and 50 angstroms.

The PFET gate 26 can comprise of poly-Si or poly-SiGe or metals such as Ta, TaN, TaSiN, TiN, Mo, Ru, Ni, NiSi or a combination thereof and can have a thickness between 500 and 1200 angstroms.

The PFET gate capping layer 28 is preferably comprised of nitride or $SiO_xN_y$ or $SiO_2$ and can have thickness between 200 and 600 angstroms.

The PFET first L shaped spacers 30 can comprise of thermal oxide or TEOS and have thickness between 20 and 200 angstroms.

Next we provide PFET SDE (source drain extension) regions 20 adjacent to the PFET gate structure 33.

Then, we provide the PFET second spacers 34 which can be comprised of nitride or oxide can have a thickness between 200 and 700 angstroms.

We preferably provide isolation regions 14 in the substrate that can separate the PFET regions from NFET regions and other regions.

B. Perform an Etch to Form a Recess

Figure 2:
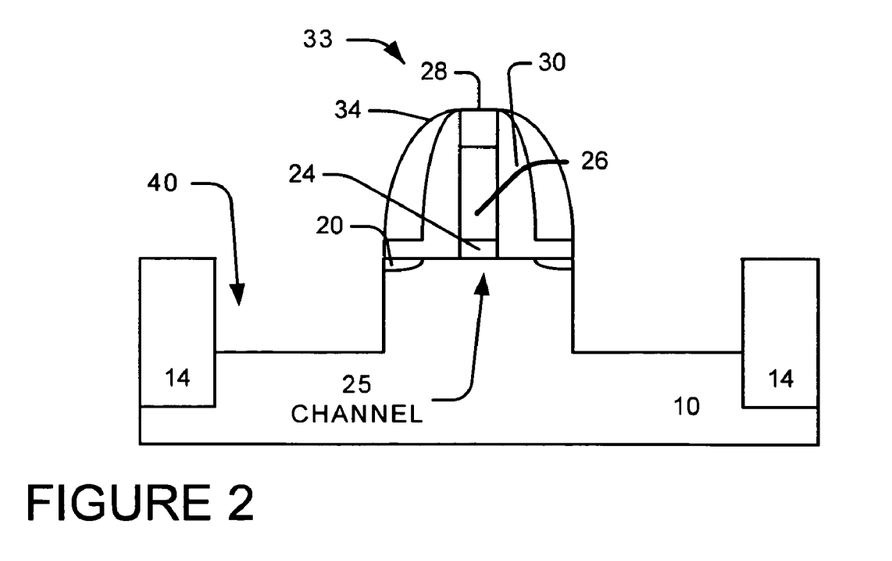

Referring to FIG. 2, we perform an etch to form a recess 40 in the substrate adjacent to the PFET gate structure. Preferably the etch is an anisotropic etch. If NFET devices are present, they can be covered by a protective layer to prevent the etch.

Preferably the recess 40 has substantially straight sidewalls and a substantially straight bottom. In general, anisotropic RIE is more stable than isotropic dry etch. The embodiment's anisotropic etch provide advantages over an isotropic etch.

C. Form an Epitaxial Layer of a Undoped or Lightly Doped Si or SiGe Buffer Layer that has Rounded Corners in the Recess to Form a Rounded Corner Recess Referring to FIG. 3, we preferably perform an epitaxy preclean. The preclean preferably contains HF, either in the gaseous or liquid state, or a combination of other chemicals and steps that include the gaseous HF or liquid HF.

Figure 3:
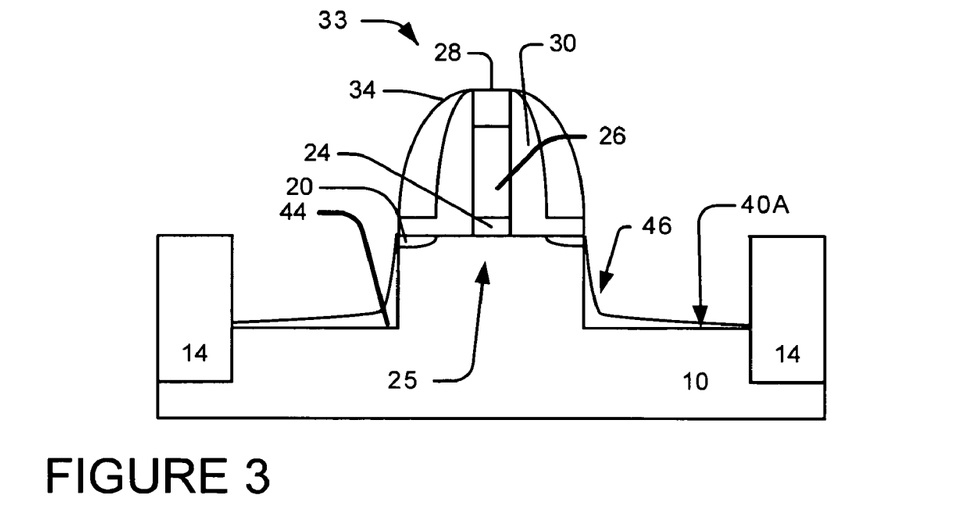

We can form an epitaxial layer 44 in the recess 40 to form a rounded corner recess 40A that has a rounded corner 46.

Prior to the epitaxy process, an optional moderate to high temperature prebake may be used to form the rounded corners 46 and to improve the interface quality by removing C or O at the surface of the recess 40. The temperature of the prebake is preferably between 750 and 1000 C, and the duration is preferably between 2 sec and 5 min. H2, N2 or a combination of both can be used as the ambient gases during prebake. The pressure is preferably between 2 and 760 Torr. Besides improving the interface quality and hence the resultant epitaxy quality, the high temperature prebake can also be used to cause rounding of the corners of recess 40. This is achieved because the surface Si atoms become mobile during the prebake and starts to move around to reduce the surface energy of the recess.

Preferably the epi layer 44 is comprised of an undoped or lightly doped Si or SiGe buffer layer that has rounded corners 46.

The epitaxial layer 44 preferably has a B doping range for the lightly doped Si or SiGe between about 0 and 1E17 atom/$cm^3$.

In the case where the epitaxial layer 44 is SiGe, epitaxial layer 44 preferably has a Ge doping range between 0 and 10 atomic percent.

A purpose of epitaxial layer 44 is form the rounded corners 46 (in addition to the prebake) and thereby define the final profile of the S/D stressor. The profile of the S/D stressor and the proximity of the S/D stressor to the channel determines the amount of stress induced in the device channel.

In addition to forming the rounded corners, epitaxial layer 44 also helps to define the final profile of the S/D stressor.

D. Forming a Graded Stressor Layer Filling the Rounded Corner Recess

Figure 4A:
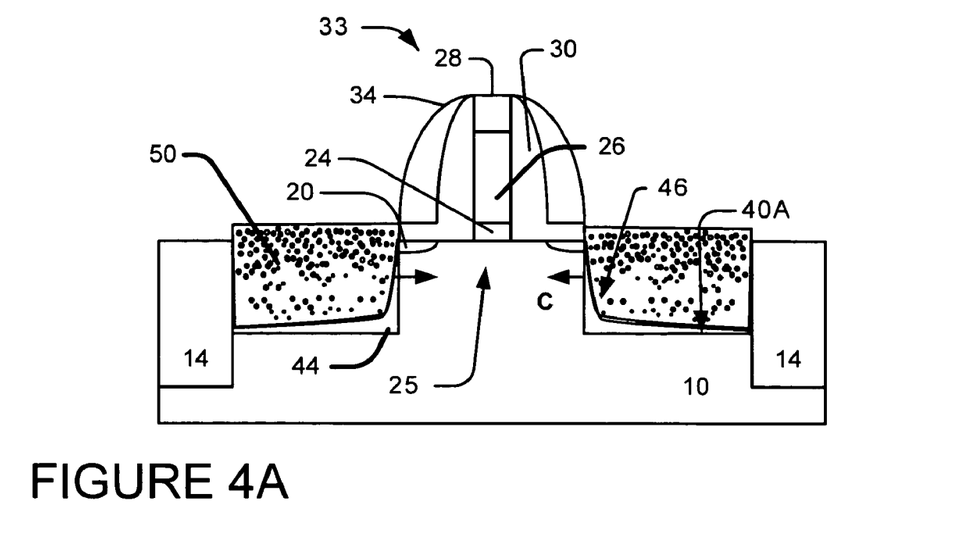

Referring to FIG. 4A, we form a graded stressor layer 50 filling the rounded corner recess 40A. The stress layer puts stress on the channel 25. The prebake, epitaxial layer 44, and the stressor 50 are preferably formed in-situ. The graded stressor layer (lattice-mismatched zone) 50 preferably comprises an alloy semiconductor material with a natural lattice constant larger than that of the substrate.

The graded stressor layer 50 is formed preferably in-situ with the epitaxial layer 44 and preferably formed using a boron doped SiGe epitaxy process with graded concentrations of B and/or Ge. It is possible that the concentration of B and/or Ge remains constant at a desired value, which means that concentration gradient of stressor layer 50 is zero.

Figure 4B:
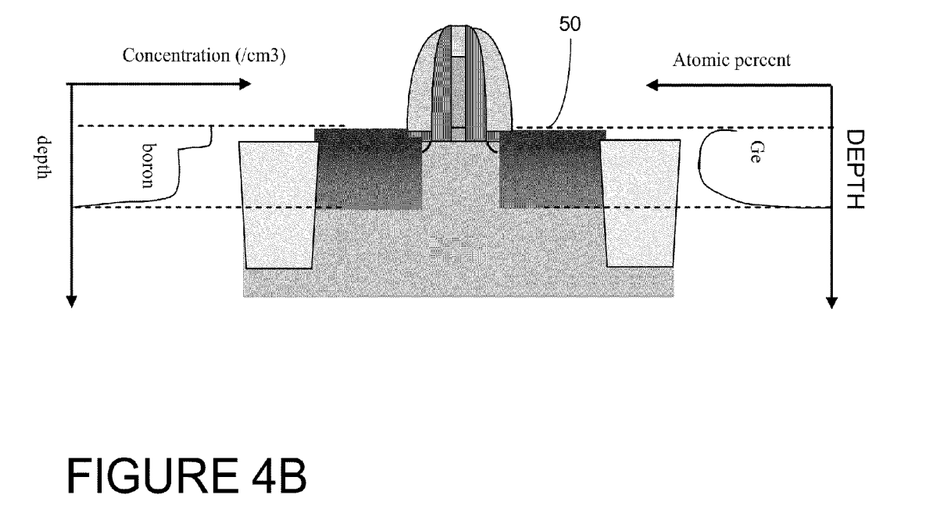
FIG. 4B is a cross sectional view of an FET with graphs overlaid that show the concentration profiles of B and Ge according to an example embodiment of the present invention.

FIG. 4B shows an example of the graded impurity and graded Ge strained graded stressor layer 50.

The graded stressor layer is preferably formed using a selective epitaxy process.

Graded Ge Profile (as Deposited)

The graded stressor layer preferably has a high concentration of the stressor material near the top substrate surface. We want a graded Ge profile because we do not really need a uniform Ge concentration throughout the stressor layer. For e.g., the Ge concentration near the original surface (before the Si recess etch) should be the highest since it is nearest to the channel to exert more stress. However, there may be silicidation problems if it is too high, hence the top most layer of the stressor should have a relatively lower Ge concentration. Similarly, the Ge concentration at the bottom should not be too high else there may be defects formed, causing strain relaxation. Also, if the Si/SiGe interface is not good, leakage current through this interface may be high.

For example, the Ge concentration at the top most surface is preferably between 5 and 15 atomic percent; the Ge concentration at the region next to the top most surface is preferably between 10 and 40 atomic percent, and the Ge concentration at the bottom of layer 50 is preferably between 0 and 20 atomic percent. Preferably the concentration changes are smooth, not abrupt or stepped. We can steadily change the Ge flow into the reactor. The temperature and pressure of the epitaxy process can also be controlled to give the graded B and/or Ge. The thickness of the top most surface layer is between 2 and 35 nm; the thickness of the (e.g., middle region) region next to the top most surface is preferably between 5 and 120 nm; and the thickness of the (bottom region) bottom of layer 50 is preferably between 2 and 15 nm.

In the stressed-channel transistor structure, the substrate 10 preferably comprises silicon, with a natural lattice constant of approximately 5.431 angstroms.

The graded stressor layer (lattice-mismatched zone) 50 preferably comprises an alloy semiconductor material such as a silicon-germanium alloy, SiAr, SiKr, or SiXe alloy. The alloy semiconductor material with a natural lattice constant between about 5.431 to 5.657 angstroms depending on concentration of germanium in the silicon-germanium alloy.

The germanium concentration in the silicon-germanium alloy of graded stressor layer (lattice-mismatched zone) 50 is preferably between about 1 and 40 atomic percent.

Therefore, graded stressor region 50 acts as a stressor and preferably exerts a compressive stress C in a source-to-drain direction on the strained channel region 25, resulting in strained channel region 25 under a compressive strain in the source-to-drain direction. Hole mobility in the strained channel region 25 is significantly enhanced, enhancing drive current when stressed-channel transistor structure in accordance with the example embodiment is a P-channel transistor structure.

Graded B Stressor Layer (Before Anneal)

The graded stressor layer preferably has a graded impurity (e.g., B) profile. We want a graded B profile because we do not really need a uniform B concentration throughout the stressor layer. For e.g., the B concentration near the top most surface should be the highest since it can reduce the series and external resistance. However, there may be severe short channel effects if the thickness of this highly B doped region exceeds a certain depth (for e.g. 20 nm). Hence the adjacent layer ("middle" layer) of the B doped stressor should have a relatively lower B concentration, yet it cannot be too low to maintain desirable low S/D sheet resistance. The B concentration at the bottom should be even lower to form a graded junction and reduce the leakage current or reduce the junction capacitance.

The B impurity concentration (before anneal) in the stressor layer near the top surface is preferably between 1E20 and 2E21 atoms/cm$^3$. The B impurity concentration at the "middle" layer is preferably between 8E19 and 1E20 atoms/cm$^3$ and the B impurity concentration near the bottom of the stressor layer 50 is preferably between 6E17 and 8E19 atoms/cm$^3$.

Both Graded Ge and B Stressor Layer

Preferably the graded stressor layer 50 has both a graded Ge and graded B concentration profile. The temperature and pressure of the chamber can be controlled during the epitaxy process to give the graded B and/or Ge. Furthermore, graded Ge can also controlled by the flow of GeH$_4$. Graded B can also controlled by the flow of B$_2$H$_6$. Both gases are flowing into the chamber independently.

"Graded" concentration means a sloped or even or gradual increase or decrease. In contrast, an abrupt concentration gradient occurs.

E. Remove the PFET Cap and the PFET Second Spacers; and Form Third Spacers on the Sidewalls of the First Spacer Referring to FIG. 5, in an optional but preferred step, we remove the PFET cap 28 and the PFET second spacers 34. Next, we form third spacers 54 on the sidewalls of the first spacer 30.

Figure 5:
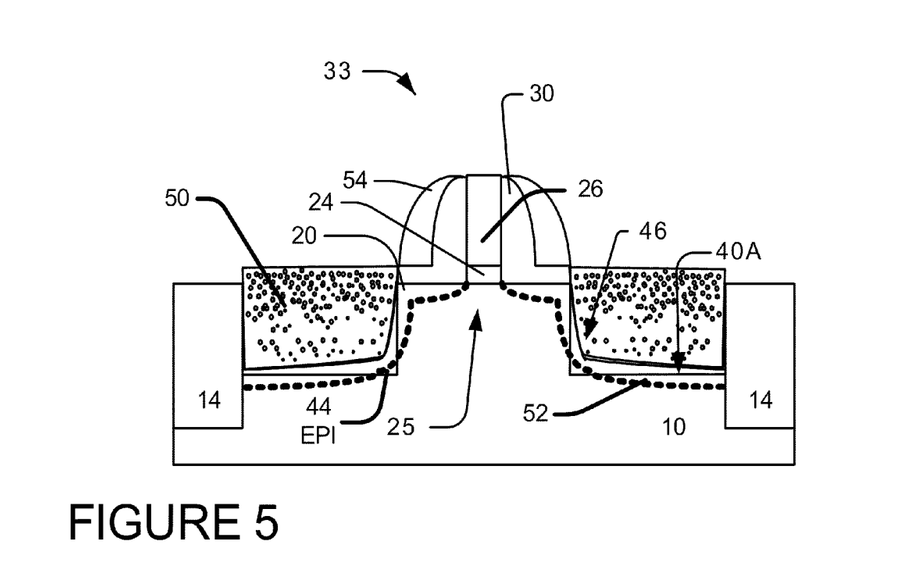

Preferably the third spacers 54 have a larger thickness than the second spacers 34. This is in order to prevent subsequent silicide to encroach into the SiGe regions or into the channel.

F. Anneal the Substrate to Form Source/Drain Regions that Diffuse from the Stressor Region into the Substrate Still referring to FIG. 5 we anneal the substrate to form source/drain regions 52 that diffuse from the stressor region 50 into the substrate 10. The source drain regions are comprised of the Stressor regions 50 and the S/D doped regions that diffuse from the stressor regions.

The anneal is preferably a spike anneal preferably performed at a temperature between 950 and 1300 C for a time between 100 microsec and 5 sec.

The stressor should be as close as possible to the channel without subjecting the transistor to short channel effects. Hence, there is an optimum position for the in-situ B doped SiGe stressor with respect to the channel.

Graded Ge Profile (after Anneal)

The Ge concentration at the top most surface is preferably between 5 and 15 atomic percent; the Ge concentration at the region next to the top most surface is preferably between 10 and 40 atomic percent, and the Ge concentration at the bottom of layer 50 is preferably between 1 and 20 atomic percent. The thickness (depth) of the (e.g., top region) top most surface layer is between 2 and 35 nm; the thickness of the (e.g., middle region) region next to the top most surface is preferably between 5 and 120 nm; and the thickness of the (bottom region) bottom of layer 50 is preferably between 2 and 15 nm.

Graded B Stressor Layer (after Anneal)

The B impurity concentration (before anneal) in the stressor layer near the top surface is preferably between 1E20 and 2E21 atoms/cm$^3$. The B impurity concentration at the "middle" layer is preferably between 8E19 and 1E20 atoms/cm$^3$ and the B impurity concentration near the bottom of the stressor layer 50 is preferably between 6E17 and 8E19 atoms/cm$^3$.

The B impurity concentration (after anneal) in the Stressor layer near the top surface is preferably between 2E20 and 2E21 atoms/cm$^3$. The B impurity concentration at the "middle" layer is preferably between 8E19 and 2E20 atoms/cm$^3$ and the B impurity concentration near the bottom of the stressor layer 50 is preferably between 6E17 and 8E19 atoms/cm$^3$.

G. Concentration Profiles

Figure 6A:
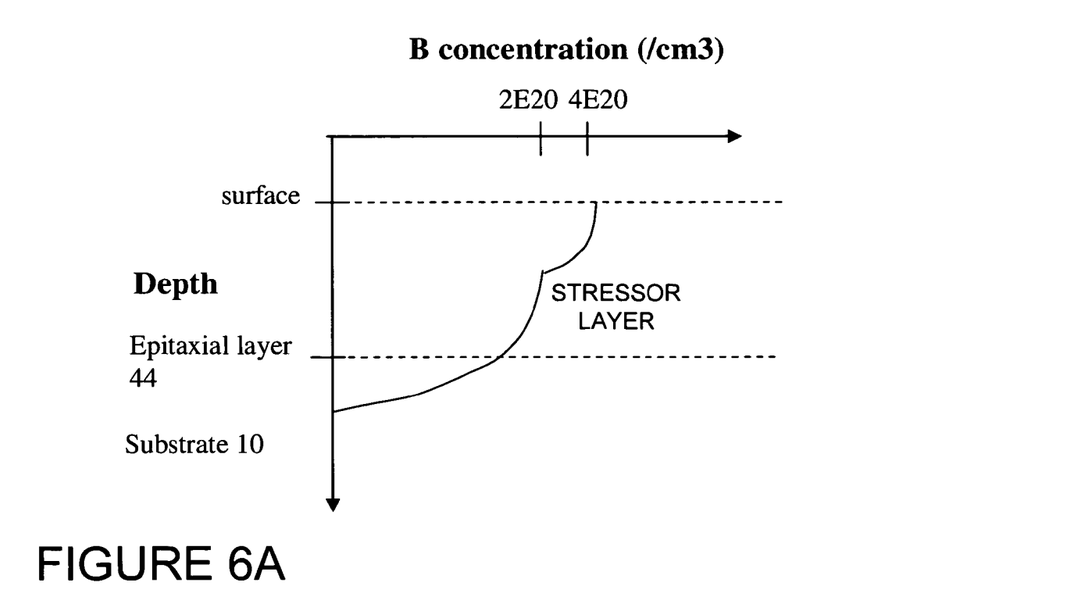
FIGS. 6A and 6B are graphs showing B and Ge concentration profiles according to an example embodiment of the present invention.
Figure 6B:
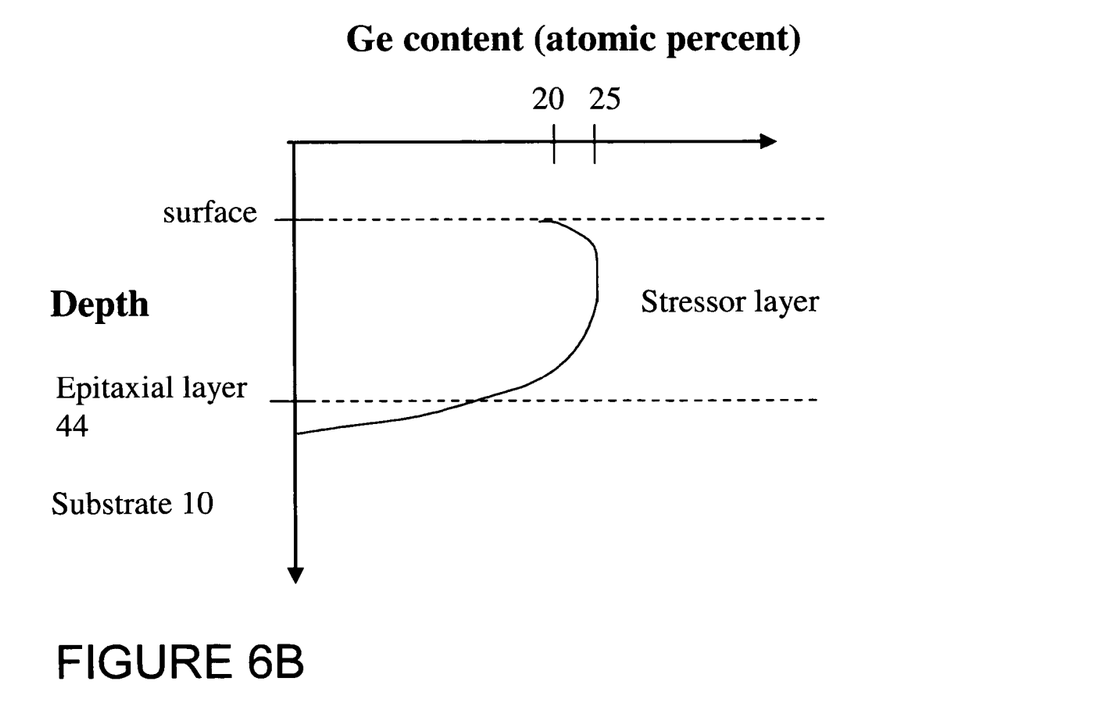

FIGS. 6A and 6B show example concentration profiles after anneal.

H. Alternate Embodiments—e.g., NFET Graded Stressor

The example embodiments can be implemented on both PFET and NFET devices. For example, the embodiments can be used on NFET with SiC stressor region (graded stressor and/or graded N-type impurity). For SiC, the C content is between 0.5 to 2.5 atomic percent. The SiC can be in-situ doped with As or P, or undoped, which is subsequently implanted with As or P.

I. Device Example Embodiments

Referring to FIG. 5. an example embodiment of a semiconductor device comprised of:

a FET gate structure over a FET region in a substrate;
FET SDE regions in said substrate adjacent to said FET gate structure;
isolation regions in said substrate around said FET region;
a recess in said substrate adjacent to said PFET gate structure;
the recess has substantially straight sidewalls and a substantially flat bottom;
an epitaxial layer over the sidewalls and bottom of the recess so to form rounded corners in the recess and to form a rounded corner recess;
a stressor layer filling the rounded corner recess; said stressor is doped with an impurity.

J. Some Non-Limiting Benefits of Some Example Embodiments

Strained silicon channels are known to be effective to increase electron or hole mobilities. One method to increase the stress/strain in the device channel is to first etch the S/D regions to a certain depth and then fill the recessed S/D with appropriate materials (such as SiGe for PFETs and SiC for NFETs), which become the S/D "stressors". The location/profile of the S/D stressors is thus defined by the recess depth/profile. In order to have the stressors to be closer to the channel, one has to ensure some degree of undercutting beneath the spacers, i.e. to etch the S/D regions isotropically. However, it is difficult to control the recess profile because the isotropic dry etch process is easily affected by the presence of residual film on the surface, as well as by the microloading effects from the neighboring protective layer (either resist, nit, or oxide) that is covering regions that should not have recess. The example embodiments allow the flexibility of using a multi-step epitaxy process to tailor the S/D stressor profile, rather than relying on the isotropic RIE process alone. Hence, the profile of the S/D stressor is NOT defined by the recess depth/profile. Furthermore, no deep S/D implants are needed since the epitaxy process can tailor the S/D junction profile.

Benefits of Graded Ge Stressor

The example embodiment's graded Ge stressor region provides the following advantages: Typically, we need a relatively high Ge concentration (~20 to 40 atomic percent) in the stressor to induce sufficiently high stress in the channel. However, this may cause a lot of defects (such as stacking fault, dislocations, misfits etc.) in the stressor film, especially at the SiGe/Si interface. Another problem is that when the Ge concentration increases, it becomes increasingly difficult to form a low resistivity silicide film with the typical metallic materials (e.g. Co, Ti, Ni or NiPt), and usually the silicide formed has poor surface and interface roughness. Hence, by having a graded Ge stressor region, e.g. low Ge concentration at the SiGe/Si interface, and low Ge concentration near the top of the stressor, the epitaxy quality will improve and it is easer to form low resistivity silicide.

Benefits of Graded B Stressor

The example embodiment's graded (e.g., B) impurity stressor region gives the following advantages: In general, the B concentration in the stressor region should be as high as possible to reduce the series resistance. However, if it is too high, the transistor may suffer from severe short channel effects. Hence, the graded (e.g, B) impurity stressor gives the flexibility to tune the active carrier profile in the S/D region such that the boron concentration at the near surface regions is extremely high ($1E20$ to $2E21/cm^3$) and boron concentration at the middle and lower portion of the S/D region is relatively low ($1E18$ to $1E20/cm^3$). The lowest portion of the S/D region should ideally be graded to reduce the junction capacitance.

K. Non-Limiting Example Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device comprising:
   providing a substrate prepared with a gate structure;
   forming a first recess in a region of the substrate adjacent to the gate structure, wherein the recess includes a first side adjacent to the gate, a second side opposing the first side and a bottom, wherein the bottom and the first side adjacent to the gate form an angled corner;
   forming an epitaxial buffer layer selectively on the first side and the bottom of the recess, wherein the buffer layer is formed under conditions which round the angled corner to produce a rounded corner in the recess; and
   forming a stressor layer in the recess with the rounded corner.

2. The method of claim 1 comprises performing a pre-bake prior to forming the epitaxial buffer layer.

3. The method of claim 1 wherein forming the stressor layer comprises forming an epitaxial stressor layer having a graded concentration of a component, wherein the concentration of the component in a middle portion of the stressor layer is higher than at top and bottom portions.

4. The method of claim 2 wherein the epitaxial buffer layer is formed on the whole first side and whole bottom of the recess, wherein the epitaxial buffer layer comprises undoped silicon, lightly doped silicon, SiC, SiGe or a combination thereof.

5. The method of claim 3 wherein forming the stressor layer comprises forming an epitaxial layer comprising Si and a component comprising Ge, Ar, Kr or Xe or a combination thereof.

6. The method of claim 5 wherein the concentration of the component at the top portion is about 5-15 atomic percent and increases to about 10-40 atomic percent in the middle portion and decreases to about 0-20 atomic percent at the bottom portion.

7. The method of claim 5 wherein the concentration of Ge at the top portion is about 5-15 atomic percent and increases to about 10-40 atomic percent in the middle portion and decreases to about 0-20 atomic percent at the bottom portion.

8. A method for forming a semiconductor device comprising:
   providing a substrate prepared with a gate;
   forming first and second stressor regions adjacent to the gate comprising etching the substrate to form recesses adjacent to the gate, wherein each of the recesses includes a first side adjacent to the gate, a second side opposing the first side and a bottom, wherein the bottom and the first side adjacent to the gate form an angled corner;
   forming a buffer layer comprising an epitaxial material, the buffer layer is selectively formed on the first sidewall and bottom of the recesses, wherein the buffer layer is formed under conditions which round the angled corner to produce a rounded corner in the recesses; and
   forming a stressor layer in the recesses with the rounded corner, wherein the stressor layer is doped with a dopant impurity.

9. A method for forming a semiconductor device comprising:
   providing a substrate prepared with a feature;
   forming a recess in a region of the substrate adjacent to the feature, wherein the recess includes a first side adjacent to the feature, a second side opposing the first side and a bottom, wherein the bottom and the first side adjacent to the feature form an angled corner;
   forming an epitaxial buffer layer selectively on the first side and the bottom of the recess, wherein the buffer layer is formed under conditions which round the angled corner to produce a rounded corner in the recess; and
   forming a stressor layer in the recess with the rounded corner.

10. The method of claim 9 further comprises a prebake prior to forming the buffer layer.

11. A method for forming a semiconductor device comprising:
   providing a substrate prepared with a gate structure;
   forming a first recess in a region of the substrate adjacent to the gate structure, wherein the recess includes a first side adjacent to the gate, a second side opposing the first side and a bottom, wherein the bottom and the first side adjacent to the gate form an angled corner;
   forming an epitaxial buffer layer selectively on the first side and the bottom of the recess, wherein the buffer layer is formed under conditions which round the angled corner to produce a rounded corner in the recess, wherein the epitaxial buffer layer comprises undoped silicon, lightly doped silicon, SiC, SiGe or a combination thereof; and
   forming a stressor layer in the recess with the rounded corner.

12. A method for forming a semiconductor device comprising:

providing a substrate prepared with a gate structure;
forming a first recess in a region of the substrate adjacent to the gate structure, wherein the recess includes a first side adjacent to the gate, a second side opposing the first side and a bottom, wherein the bottom and the first side adjacent to the gate form an angled corner;
processing the substrate to transform the angled corner to a rounded corner, wherein the rounded corner is devoid of angles, the processing comprises a prebake at a sufficiently high temperature to reduce surface energy of the first side and bottom of the recess to facilitate forming the rounded corner;
forming a stressor layer in the rounded corner recess, wherein
   forming the stressor layer comprises forming an epitaxial stressor layer comprising Si and a component comprising Ge, Ar, Kr or Xe or a combination thereof, and
   the stressor layer comprises a graded concentration of the component, wherein the concentration of the component in a middle portion of the stressor layer is higher than at top and bottom portions; and
wherein the stressor layer comprises B dopants, wherein the concentration of B dopants at the top portion is about 1E20-2E21 atoms/cm$^3$ and decreases to about 6E17-8E19 atoms/cm$^3$ at the bottom portion.

13. The method of claim 12 wherein:
the component comprises Ge; and
the concentration of Ge at the top portion is about 5-15 atomic percent and increases to about 10-40 atomic percent in the middle portion and decreases to about 0-20 atomic percent at the bottom portion.

14. A method for forming a semiconductor device comprising:
providing a substrate prepared with a gate;
forming first and second stressor regions adjacent to the gate comprising etching the substrate to form recesses adjacent to the gate, wherein each of the recesses includes a first side adjacent to the gate, a second side opposing the first side and a bottom, wherein the bottom and the first side adjacent to the gate form an angled corner;
performing a prebake prior to forming an epitaxial buffer layer wherein the prebake is performed at a temperature of at least about 750-1000° C.;
forming the epitaxial buffer layer selectively on the first sidewall and bottom of the recesses, wherein the buffer layer is formed under conditions which round the angled corner to produce a rounded corner in the recesses; and
forming a stressor layer in the recesses with the rounded corner, wherein the stressor layer is doped with a dopant impurity.

15. The method of claim 14 wherein:
forming the stressor layer comprises forming an epitaxial stressor layer.

16. The method of claim 14 wherein:
the epitaxial buffer layer comprises undoped silicon, lightly doped silicon, SiC, SiGe or a combination thereof; and
forming the stressor layer comprises forming an epitaxial layer comprises Si with and a component comprising Ge, Ar, Kr or Xe or a combination thereof, the stressor layer comprises a graded concentration of the component, wherein the concentration of the component is greater at a middle portion than at top and bottom portions.

17. The method of claim 15 wherein the stressor layer comprises a component with a graded concentration, the concentration of the component at a top portion is about 5-15 atomic percent and increases to about 10-40 atomic percent in the middle portion and decreases to about 0-20 atomic percent at a bottom portion.

18. The method of claim 16 wherein the concentration of the component at the top portion is about 5-15 atomic percent and increases to about 10-40 atomic percent in the middle portion and decreases to about 0-20 atomic percent at a bottom portion.

19. The method of claim 16 wherein the component comprises Ge, the concentration of Ge at the top portion is about 5-15 atomic percent and increases to about 10-40 atomic percent in the middle portion and decreases to about 0-20 atomic percent at a bottom portion.

20. The method of claim 16 wherein the stressor layer comprises a B doped stressor layer with a graded concentration, the concentration of B dopants at the top portion is about 1E20-2E21 atoms/cm$^3$ and decreases to about 6E17-8E19 atoms/cm$^3$ at the bottom portion.

21. The method of claim 16 wherein:
the component comprises Ge, the concentration of Ge at the top portion is about 5-15 atomic percent and increases to about 10-40 atomic percent in the middle portion and decreases to about 0-20 atomic percent at a bottom portion; and
the stressor layer comprises a B doped stressor layer with a graded concentration, the concentration of B dopants at the top portion is about 1E20-2E21 atoms/cm$^3$ and decreases to about 6E17-8E19 atoms/cm$^3$ at the bottom portion.

* * * * *